(12) United States Patent
Gu et al.

(10) Patent No.: US 9,347,990 B2
(45) Date of Patent: May 24, 2016

(54) COMMUNICATION DEVICE, TEST SYSTEM AND TEST METHOD THEREOF

(71) Applicant: Spreadtrum Communications (Shanghai) Co., Ltd., Shanghai (CN)

(72) Inventors: Xiangxin Gu, Shanghai (CN); Shijun Cui, Shanghai (CN); Liangliang Luo, Shanghai (CN); Mingwei Zhang, Shanghai (CN)

(73) Assignee: SPREADTRUM COMMUNICATIONS (SHANGHAI) CO., LTD. (CN)

( * ) Notice: Subject to any disclaimer, the term of this patent is extended or adjusted under 35 U.S.C. 154(b) by 173 days.

(21) Appl. No.: 14/285,023

(22) Filed: May 22, 2014

(65) Prior Publication Data

US 2014/0359384 A1    Dec. 4, 2014

(30) Foreign Application Priority Data

May 30, 2013    (CN) .......................... 2013 1 0210326

(51) Int. Cl.
*G01R 31/28* (2006.01)
*G06F 11/00* (2006.01)
*G01R 31/3177* (2006.01)
*H04M 1/24* (2006.01)
*H04L 12/26* (2006.01)

(52) U.S. Cl.
CPC ............. *G01R 31/3177* (2013.01); *H04M 1/24* (2013.01); *H04L 43/50* (2013.01); *H04M 2250/02* (2013.01)

(58) Field of Classification Search
CPC   G01R 31/3177; H04L 43/50; H04L 41/0803; H04L 41/0813; H04M 3/30; H04M 3/28; H04M 1/24; H04M 2250/02
USPC ......... 714/724, 725, 734, 733, 741, 5.11, 5.1, 714/10, 12, 30, 31; 324/347, 750.15, 324/750.19, 750.24, 750.3, 756.05, 757.01; 370/241, 242, 250, 357, 360, 362
See application file for complete search history.

(56) References Cited

U.S. PATENT DOCUMENTS 6,370,658 B2 *  4/2002  Jeong ............... G01R 31/31728
                                                        714/25
6,754,730 B2 *  6/2004  Kuan ...................... H04L 43/00
                                                        370/241

(Continued)

FOREIGN PATENT DOCUMENTS

CN             1193240 A        9/1998

OTHER PUBLICATIONS

Chinese Summary of the 1st Office Action corresponding to Patent No: 2013102103261; Issue Date: Jan. 29, 2016, with English translation.

*Primary Examiner* — Christine Tu
(74) *Attorney, Agent, or Firm* — Cantor Colburn LLP

(57) ABSTRACT

A communication device is provided, which includes: a baseband chip; a target test chip integrated into the baseband chip; an upper-layer processing unit corresponding to the target test chip; and at least one data transport interface and at least one data processing unit corresponding to the at least one data transport interface. The communication device further includes: a first switch, adapted to connect the target test chip with the at least one data transport interface or the upper-layer processing unit; a second switch, adapted to connect the at least one data transport interface with its corresponding data processing unit or the target test chip; and a test control unit, configured to control the first switch and the second switch to connect the data transport interface with the target test chip, so as to enable the communication device to test the target test chip.

20 Claims, 7 Drawing Sheets

(56) References Cited

U.S. PATENT DOCUMENTS 7,208,968 B2   4/2007  Weber et al.
2001/0023491 A1   9/2001  Jeong
2003/0196017 A1   10/2003  Kuan et al.
2011/0083042 A1*  4/2011  Chang .................. G06F 3/0416
                                                              714/31

* cited by examiner

COMMUNICATION DEVICE, TEST SYSTEM AND TEST METHOD THEREOF

CROSS REFERENCE TO RELATED APPLICATIONS

The present application claims priority to Chinese patent application No. 201310210326.2, filed on May 30, 2013, and entitled "Communication Device, Test System and Test Method thereof", the entire disclosure of which is incorporated herein by reference.

TECHNICAL FIELD

The present disclosure generally relates to communication field, and more particularly, to a communication device, a test system and a test method thereof.

BACKGROUND

Nowadays, integrated chips are developed with the development of semiconductor technology. Integrated chip combines multiple chips into a single one, which enables an electronic product to accomplish more functions with smaller size. For example, a conventional baseband chip in a communication device has integrated different functions of multiple peripheral chips, which makes the communication device have a thin and compact appearance.

A typical application of integrated chip is to integrate a Bluetooth chip into a baseband chip. Thus, the communication device can accomplish functions of both baseband and Bluetooth without an additional Bluetooth chip, which saves cost for the communication device. The Bluetooth chip integrated into the baseband chip can communicate for data interaction with a Bluetooth host through a Host Control Interface (HCI), which is specified in Bluetooth protocol, such as a Universal Asynchronous Receiver/Transmitter (UART) interface or a Universal Serial Bus (USB) interface, or through a shared memory. No matter which type of data interaction is selected, the Bluetooth chip integrated into the baseband chip needs to be tested by a dedicated test equipment of the Bluetooth Qualify Body (BQB). If the Bluetooth chip is not integrated into the baseband chip, the test is performed by connecting, directly or indirectly, the Bluetooth chip with the test equipment via a particular data lead on the Bluetooth chip. This test method is simple and easy to be achieved. However, if the existing method is also used to test the Bluetooth chip integrated into the baseband chip, the baseband chip has to reserve two data leads dedicated for connecting a test equipment with the Bluetooth chip. However, the reserved data leads are unused when the communication device is in a normal operation mode. Accordingly, the conventional test method may cause a huge waste of lead resources which are very precious for baseband chips.

More information about related techniques may refer to U.S. Pat. No. 7,208,968B2.

SUMMARY

Embodiments of the present disclosure provide communication devices, test systems and test methods.

According to one embodiment of the present disclosure, a communication device is provided. The communication device may include:
a baseband chip;
a target test chip integrated into the baseband chip;
an upper-layer processing unit corresponding to the target test chip; and
at least one data transport interface and at least one data processing unit corresponding to the at least one data transport interface,
wherein the communication device further includes:
a first switch, adapted to connect the target test chip with the at least one data transport interface or the upper-layer processing unit;
a second switch, adapted to connect the at least one data transport interface with its corresponding data processing unit or the target test chip; and
a test control unit, configured to control the first switch and the second switch to connect the data transport interface with the target test chip, so as to enable the communication device to test the target test chip.

In some embodiments, the communication device may further include a format conversion unit configured to, when a first format of commands, instructions or data received and transmitted by the target test chip is different from a second format of commands, instructions or data received and transmitted by the test equipment, convert the first format of commands, instructions or data into the second format of commands, instructions or data, or convert the second format of commands, instructions or data into the first format of commands, instructions or data under control of the test control unit.

In some embodiments, the communication device may further include a third switch connected with the format conversion unit, which is configured to connect the format conversion unit with the at least one data transport interface under the control of the test control unit, such that a connection between the target test chip and the at least one data transport interface is established through the first switch, the format conversion unit and the third switch.

In some embodiments, the communication device may further include a third switch, wherein the first switch and the third switch are configured to: under the control of the test control unit, respectively connect the target test chip with the format conversion unit and connect the format conversion unit with the at least one data transport interface; or, under the control of the test control unit, connect the target test chip with the at least one data transport interface.

In some embodiments, the test control unit is further configured to control the first switch to connect the target test chip with the upper-layer processing unit, and control the second switch to connect the at least one data transport interface with its corresponding data processing unit.

In some embodiments, the target test chip is a Bluetooth chip, and the upper-layer processing unit is a Bluetooth host.

In some embodiments, the at least one data transport interface includes at least one of UART data transport interface or USB data transport interface.

In some embodiments, the first switch or the second switch is implemented in hardware or software.

In some embodiments, the first switch, the second switch or the third switch is implemented in hardware or software.

In some embodiments, the communication device may further include a multimedia interface control unit configured to display an operation interface on a multimedia interface of the communication device, and translate an operation signal generated by user operation into a control signal to the test control unit.

According to one embodiment of the present disclosure, a test system is provided, which may include a communication device described above, and a test equipment for testing a target test chip included in the communication device.

According to one embodiment of the present disclosure, a test method of the test system is provided. The test method may include:

controlling the first switch and the second switch of the communication device to connect the target test chip with the at least one data transport interface;

connecting the test equipment with the at least one data transport interface; and testing the target test chip using the test equipment.

In some embodiments, the test method may further include: when a first format of commands, instructions or data received and transmitted by the target test chip is different from a second format of commands, instructions or data received and transmitted by the test equipment, converting the first format of commands, instructions or data into the second format of commands, instructions or data, or converting the second format of commands, instructions or data into the first format of commands, instructions or data.

In some embodiments, converting the format of the commands, instructions or data may include:

analyzing commands, instructions or data in a first format which are transmitted by the test equipment, and packaging the analyzed commands, instructions or data into a second format of commands, instructions or data which are suitable for being received by the target test chip; and analyzing commands, instructions or data in the second format which are transmitted by the target test chip, and packaging the analyzed commands, instructions or data into the first format of commands, instructions or data which are suitable for being received by the test equipment.

In some embodiments, connecting the target test chip with the at least one data transport interface may include: when the number of the at least one data transport interface is greater than 1, selecting one data transport interface of the at least one data transport interface to be connected with the target test chip.

In some embodiments, connecting the test equipment with the at least one data transport interface may include: when the number of the at least one data transport interface is greater than 1, connecting the test equipment with one of the at least one data transport interface which matches a format of the commands, instructions or data transmitted and received by the test equipment.

In some embodiments, the test method may further include: after testing of the target test chip, controlling the first switch to connect the target test chip with its corresponding upper-layer processing unit, and controlling the second switch to connect the at least one data transport interface with its corresponding data processing unit.

In some embodiments, the test method may further include: receiving an operation signal generated based on user's operation; and transforming the operation signal into a control signal to the test control unit, so as to control the first switch and the second switch according to the control signal.

Embodiments of this disclosure may have following advantages.

By means of one or more software or hardware switches, the target test chip integrated into the baseband chip can be directly connected with one of the data transport interface(s) of the communication device, through which the target test chip can communicate data with the dedicated test equipment. In such way, testing the target test chip can be realized. There is no need to reserve in the baseband chip a plurality of data leads dedicated for testing the target test chip, so that lead resources of the baseband chip can be saved and thus system performance of the communication device may be improved.

Furthermore, when a first format of commands, instructions or data received and transmitted by the target test chip are different from a second format of commands, instructions or data received and transmitted by the test equipment, the format conversion unit can convert the first format of commands, instructions or data into the second format of commands, instructions or data, or convert the second format of commands, instructions or data into the first format of commands, instructions or data. By contrast, the format conversion according to the present disclosure can be performed without the need of storage resources of the target test chip, which causes the cost lowered.

DETAILED DESCRIPTION

In order to clarify the objects, characteristics and advantages of the disclosure, the embodiments of the present disclosure will be described in detail in conjunction with the accompanying drawings.

Figure 1:
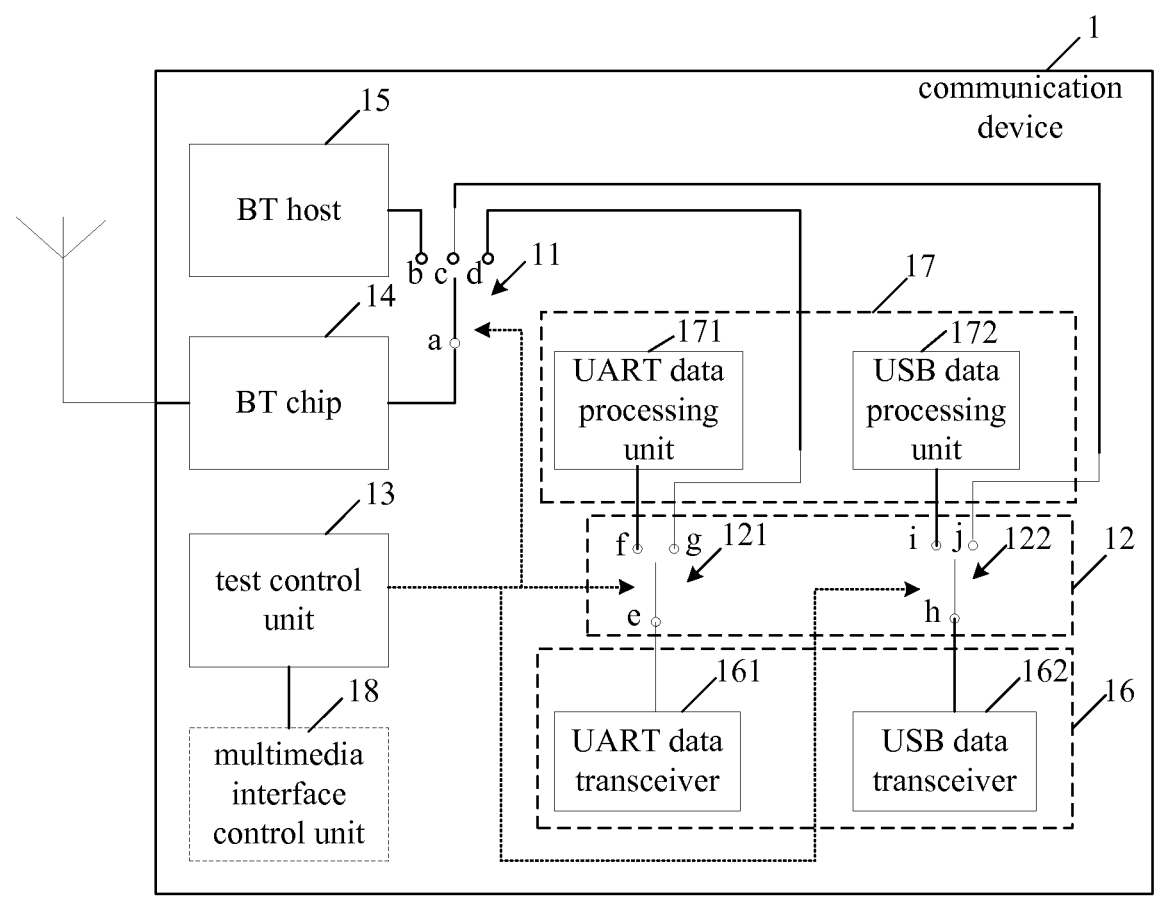
FIG. 1 schematically illustrates a structural diagram of a communication device according to one embodiment of the present disclosure.

FIG. 1 schematically illustrates a structural diagram of a communication device 1 according to one embodiment of the present disclosure. The communication device 1 includes a Bluetooth chip 14 (Bluetooth may be abbreviated as BT) which is integrated in a baseband chip of the communication device 1. The communication device 1 also includes a Bluetooth host 15 as an upper-layer processing unit for the Bluetooth chip 14. The communication device 1 further includes a data transport interface 16 and a data processing unit 17. In some embodiments, the data transport interface 16 is composed of a UART data transport interface 161 and a USB data transport interface 162, and the data processing unit 17 is composed of a UART data processing unit 171 and a USB data processing unit 17 respectively corresponding to the UART data transport interface 161 and the USB data transport interface 162. Generally, a communication device, such as a mobile phone, shall have a tail plug, such that operations like charging, debugging, data transmitting, and software updating can be performed to the communication device through the tail plug. In some embodiments, the UART data transport interface 161 and the USB data transport interface 162 may be implemented by means of a tail plug. When in use, UART data or USB data may be sent and/or received through the tail plug. In some embodiments, if the communication device has more than one tail plug, one or more tail plugs may be specified to transport UART data or USB data.

In order to test the Bluetooth chip 14, the communication device 1 further includes a first switch 11, a second switch 12 and a test control unit 13. The first switch 11 may be adapted to connecting the Bluetooth chip 14 with the data transport interface 16 or connecting the Bluetooth chip 14 with the Bluetooth host 15. The second switch 12 may be adapted to connecting the data transport interface 16 with the data processing unit 17 or the Bluetooth chip 14. As the data transport interface 16 is composed of the UART data transport interface 161 and the USB data transport interface 162, the second switch 12 is correspondingly composed of two switches, including a switch 121 and a switch 122. The switch 121 may be adapted to connecting the UART data transport interface 161 with the UART data processing unit 171 or the Bluetooth chip 14. The switch 122 may be adapted to connecting the USB data transport interface 162 with the USB data processing unit 172 or the Bluetooth chip 14. The test control unit 13, marked with dashed arrow in FIG. 1, is configured to control the first switch 11 and the second switch 12. In such a way, the communication device 1 may enter into a test mode to test the Bluetooth chip 14 when the data transport interface 16 is connected with the Bluetooth chip 14; or, the communication device 1 may enter into a normal operation mode when the Bluetooth chip 14 is connected with the Bluetooth host 15 and the data transport interface 16 is connected with the corresponding data processing unit 17. In some other embodiments, the data transport interface 16 of the communication device 1 may only include one of the UART data transport interface 161 and the USB data transport interface 162. Accordingly, the data processing unit 17 may only include one of the UART data processing unit 171 and the USB data processing unit 172, which one is corresponding to the particular interface of the data transport interface 16. In this case, the first switch may have two destinations to be connected with and so that a two-way switch (e.g., a single-pole double-throw switch) may be used, while the second switch may only include one of the switch 121 and the switch 122. In some embodiments, the first switch 11 and the second switch 12 may be implemented in hardware or software. For a hardware example, in embodiments as shown in FIG. 1, the first switch 11 is a three-way switch (in some other embodiments, the first switch 11 may be a two-way switch), and the second switch 12 is a two-way switch. For software implementations, a plurality of applications may be used. Specific configurations of practical software switched may be determined based on specific software environment in the communication device 1, which is not described in detail herein.

Figure 2:
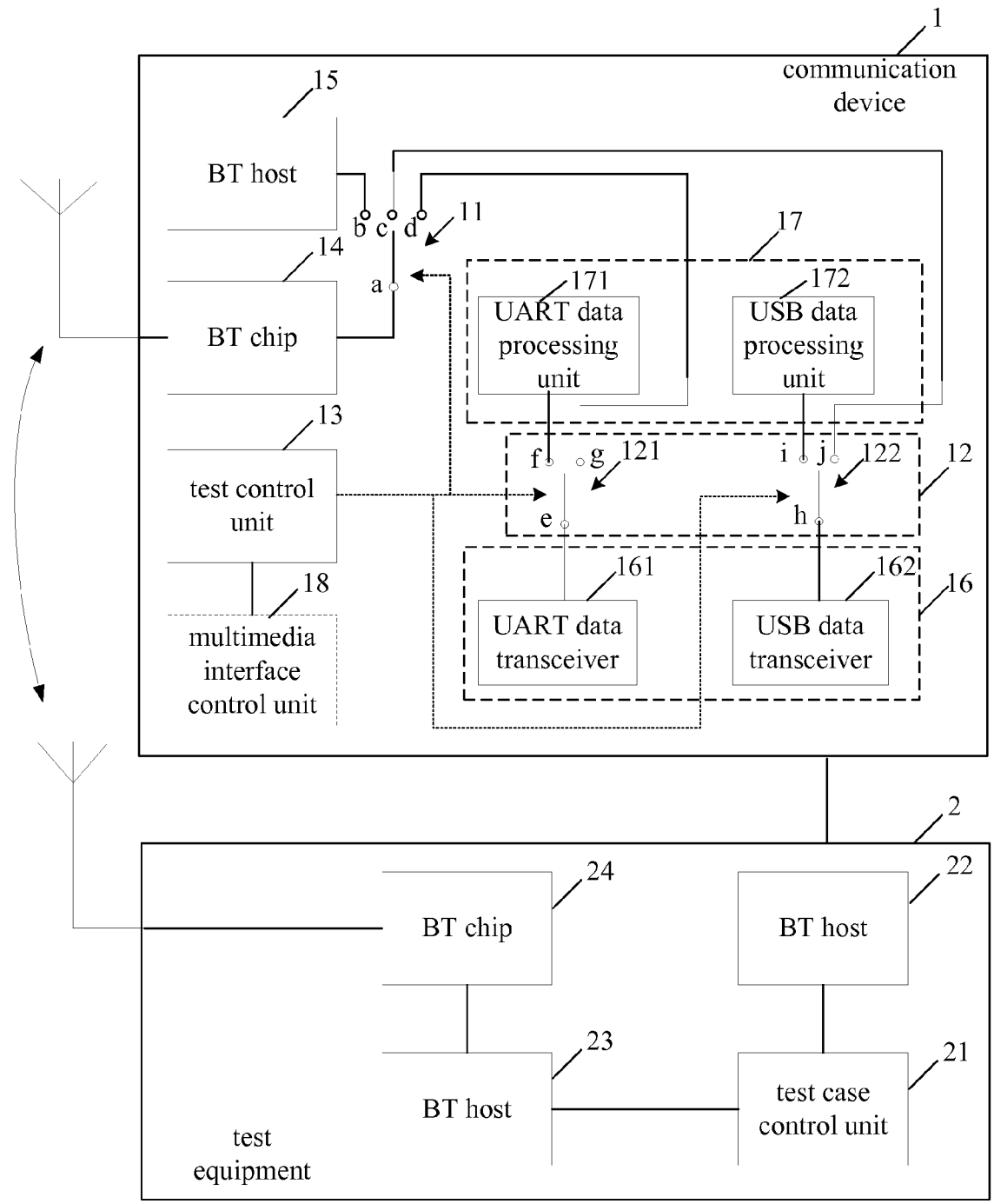
FIG. 2 schematically illustrates a structural diagram of a test system according to one embodiment of the present disclosure.

As shown in FIG. 2, when the test control unit 13 of the communication device 1 controls the first switch 11 and the second switch 12 to connect the data transport interface 16 with the Bluetooth chip 14, the Bluetooth chip 14 is connected to a test equipment 2 through the tail plug of the communication device 1. In such a way, a test system applicable for testing the Bluetooth chip 14 may be established. In order to facilitate testing the Bluetooth chip 14, in some embodiments, the communication device 1 may further include a multimedia interface control unit 18. As such, an operation interface related to the test control unit 13 may be displayed on a multimedia interface of the communication device 1, and an operation signal generated by user actions may be translated into a control signal to the test control unit 13.

Figure 3:
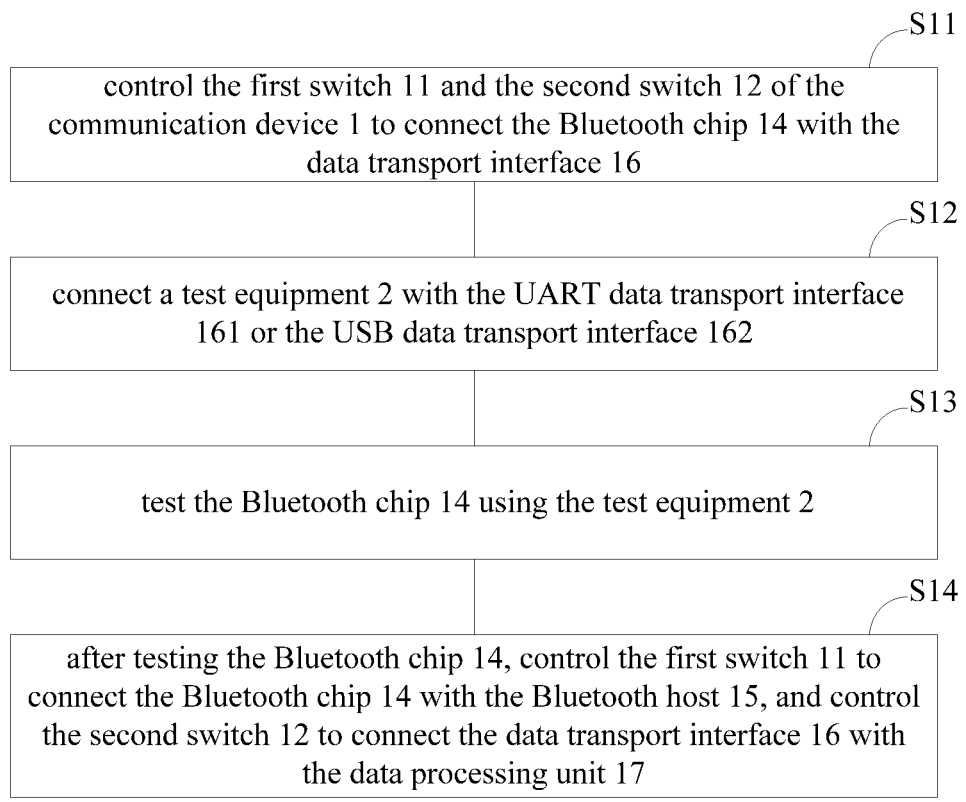
FIG. 3 schematically illustrates a flow chart of a test method according to one embodiment of the present disclosure.

In some embodiments, a test method of the test system is provided. As shown in FIG. 3, the test method includes steps S11, S12, S13 and S14.

In step S11, control the first switch 11 and the second switch 12 of the communication device 1 to connect the Bluetooth chip 14 with the data transport interface 16. Referring still to FIG. 2, to connect the Bluetooth chip 14 with the data transport interface 16, both the first switch 11 and the second switch 12 are required to be controlled. Specifically, when the test control unit 13 controls "node a" (illustrated as "a" in figures) and "node d" of the first switch 11 to be connected, and, "node e" and "node g" of the switch 121 to be connected, a connection is established between the Bluetooth chip 14 and the UART data transport interface 161. Similarly, when the test control unit 13 controls "node a" and "node c" of the first switch 11 to be connected, and "node h" and "node j" of the second switch 12 to be connected, a connection is established between the Bluetooth chip 14 and the USB data transport interface 162. In test, any one of the UART data transport interface 161 and the USB data transport interface 162 may be selected to be connected with the Bluetooth chip 14, depending on which type a data transport interface equipped in the test equipment 2 is. That is, a data transport interface which matches a format of commands, instructions or data received and transmitted by the test equipment 2 may be selected. In some embodiments, the communication device 1 may only include one data transport interface, such as the UART data transport interface 161 or the USB data transport interface 162. In such case there is no need to select an interface, just need to control the first switch 11 and the second switch 12 to connect the Bluetooth chip 14 with the data transport interface, such as the UART data transport interface 161 or the USB data transport interface 162.

In step S12, connect a test equipment 2 with the UART data transport interface 161 or the USB data transport interface 162. The connection between the Bluetooth chip 14 and the data transport interface 16 is established in S11. Therefore, as long as the data transport interface 16 which has been connected with the Bluetooth chip 14 is connected with the test equipment 2, the Bluetooth chip 14 and the test equipment 2 get into connection. When the UART data transport interface 161 and the USB data transport interface 162 share a tail plug of the communication device 1, the same hardware wiring is also shared by them. In this case, the data transport interface 16 selected for the Bluetooth chip 14 should match the type of the data transport interface type equipped in the test equipment 2. Otherwise, the Bluetooth chip 14 can not communicate with the test equipment 2 as expected.

In some embodiments, S12 may be performed prior to S11. That is, the test equipment 2 may be connected with the data transport interface 16 in advance. Then, according to which data transport interface is selected in S12, the Bluetooth chip 14 may be connected with one of the UART data transport interface 161 and the USB data transport interface 162.

In step S13, test the Bluetooth chip 14 using the test equipment 2. Still referring to FIG. 2, the test equipment 2 includes a test case control unit 21, a Bluetooth chip 24, a first Bluetooth host 22 and a second Bluetooth host 23. The Bluetooth chip 24 and the second Bluetooth host 23 constitute a first Bluetooth data transceiver of the test system, while the first Bluetooth host 22 and the Bluetooth chip 14 of the communication device 1 constitute a second Bluetooth data transceiver of the test system. As such, the test case control unit 21 of the test equipment 2 may invoke a test case stored in the test equipment 2, and enable test data communicated between the first and the second Bluetooth data transceivers through wireless interfaces of the test equipment 2 and the communication device 1. Therefore, whether the Bluetooth chip 14 functions normally or not can be tested.

In step S14, after testing the Bluetooth chip 14, control the first switch 11 to connect the Bluetooth chip 14 with the Bluetooth host 15, and control the second switch 12 to connect the data transport interface 16 with the data processing unit 17. S14 ends the test of the Bluetooth chip 14 by enabling the communication device 1 to return to normal operation mode. In this case, "node a" and "node b" of the first switch 11 are connected so that the Bluetooth chip 14 can communicate with the Bluetooth host 15; and, "node e" and "node f" of the switch 121 are connected so that the UART data transport interface 161 recovers connection with the corresponding UART data processing unit 171; and, "node h" and "node i" of the switch 122 are connected so that the USB data transport interface 162 recovers connection with the corresponding USB data processing unit 172. As such, the communication device 1 starts to operate normally.

If the communication device 1 further includes a multimedia interface control unit 18, the operations executed in S11 to S14 may be controlled through a multimedia interface of the communication device 1 to test the Bluetooth chip 14. Specifically, when a user operates on the multimedia interface, an operation signal may be generated. The operation signal will be translated by the multimedia interface control unit 18 into a control signal recognizable for the test control unit 13. The control signal is then transmitted to the test control unit 13 to control the first switch 11 and the second switch 12.

From above, by adding one or more switches, the communication device 1 provided in embodiments of the present disclosure could be readily for testing the Bluetooth chip 14 integrated in the baseband chip of the communication device 1, which is simple for implementation compared with the existing technology. Furthermore, no additional data leads are required for the baseband chip, which thus save system resources. The test control unit 13 may be implemented using a memory of the communication device 1 without occupying storage resource of the Bluetooth chip 14, which may reduce the cost of the Bluetooth chip 14. Especially in the case of software implementation, the switches can be implemented by means of the already-existed memory of the communication device 1. Accordingly, testing of the Bluetooth chip 14 can be achieved without change of the hardware circuits of the communication device 1.

In addition, after testing the Bluetooth chip 14, the communication device 1 can return to normal operation mode by controlling the first switch 11 and the second switch 12. Therefore, the communication device 1 can be easily switched between the test mode and the operation mode, which thereby meets needs of various application scenarios.

Figure 4:
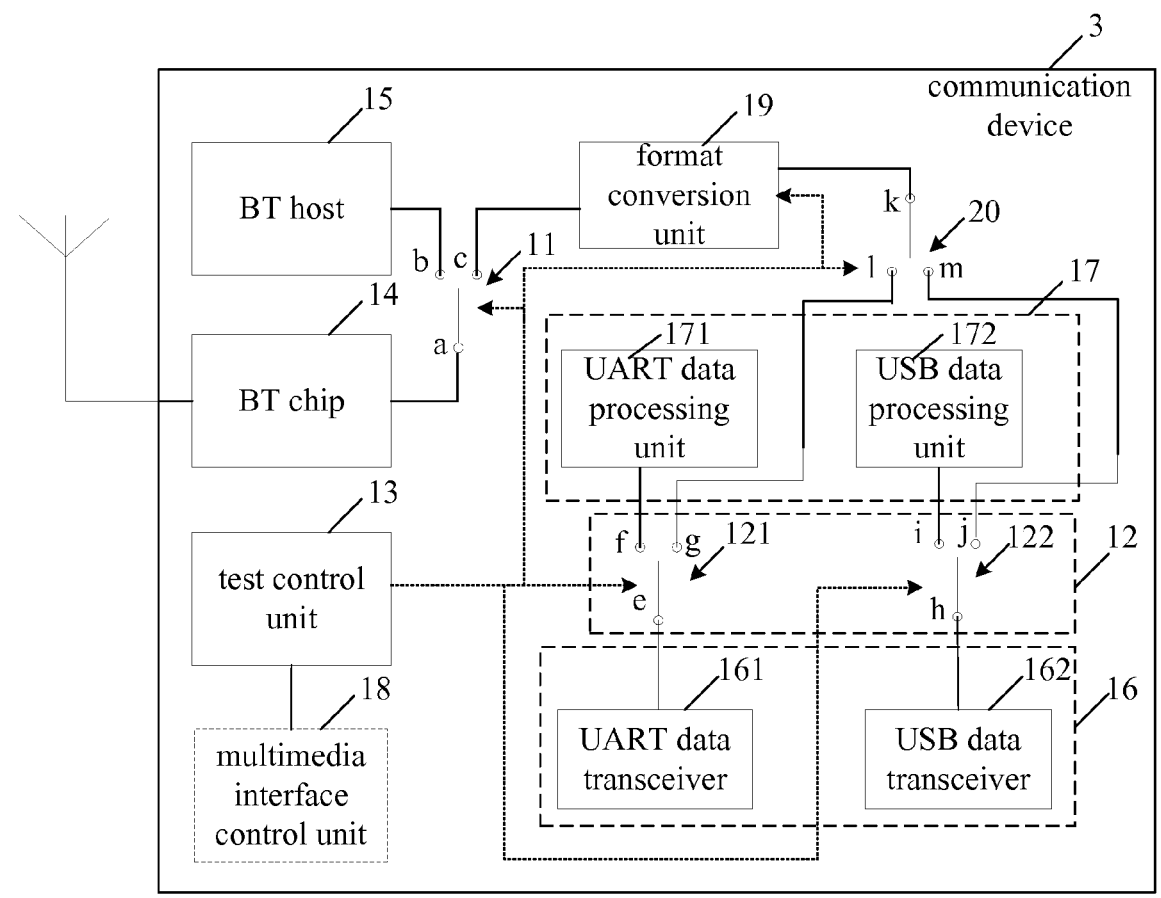
FIG. 4 schematically illustrates a structural diagram of a communication device according to one embodiment of the present disclosure.

FIG. 4 schematically illustrates a structural diagram of a communication device 3 according to one embodiment of the present disclosure. Referring to FIG. 4, the communication device 3 includes a Bluetooth chip 14, a Bluetooth host 15, a data transport interface 16, a data processing unit 17, a first switch 11, a second switch 12, a test control unit 13, a format conversion unit 19 and a third switch 20. Compared with the embodiment illustrated in FIG. 1 and FIG. 2, the format conversion unit 19 and the third switch 20 connected therewith are added between the first switch 11 and the second switch 12. According to the embodiment illustrated in FIG. 1 and FIG. 2, the first switch 11 can directly control a connection between the target test chip and the data transport interface. Whereas, the first switch according to the embodiment illustrated in FIG. 4 and FIG. 5 can do this by means of the format conversion unit 19 and the third switch 20. Specifically, the format conversion unit 19 is configured to, when a first format of commands, instructions or data received and transmitted by the Bluetooth chip 14 is different from a second format of commands, instructions or data received and transmitted by the test equipment 2, under the control of the test control unit 13, convert the first format of commands, instructions or data into the second format of commands, instructions or data, or convert the second format of commands, instructions or data into the first format of commands, instructions or data. The third switch 20 connected with the format conversion unit 19 is configured to connect the format conversion unit 19 with the data transport interface 16 under the control of the test control unit 13. The communication device 3 is suitable for an application scenario that a format of commands, instructions or data communicated between the Bluetooth chip 14 and the Bluetooth host 15 is different from a format of commands, instructions or data communicated through the data transport interface 16, (that is, a format of commands, instructions or data communicated between the Bluetooth chip 14 and the Bluetooth host 15 is different from a format of commands, instructions or data communicated by the test equipment 2). Besides the control of the first switch 11, the second switch 12 and the third switch 20, the test control unit 13 may further control the format conversion unit 19. In the communication device 3, the operations and connection relationships of the Bluetooth chip 14, the Bluetooth host 15, the data transport interface 16, the data processing unit 17, the first switch 11 and the second switch 12, are similar to those in the communication device 1 illustrated in FIG. 1 and FIG. 2, which are not described in detail herein.

The third switch 20 connected with the format conversion unit 19 may be used to select an appropriate data transport interface 16 to be connected with the format conversion unit 19. Similar to the first switch 11 and the second switch 12, the third switch 20 may be implemented in hardware or software. In some embodiments, if the communication device only includes one of the UART data transport interface 161 and the USB data transport interface 162, there is no need for the third switch 20. The format conversion unit 19 just needs to be directly connected with the UART data transport interface 161 through the switch 121, or with the USB data transport interface 162 through the switch 122. In this case, the data processing unit 17 also only includes a correspondingly data processing unit, such as the UART data processing unit 171 or the USB data processing unit 172.

Figure 5:
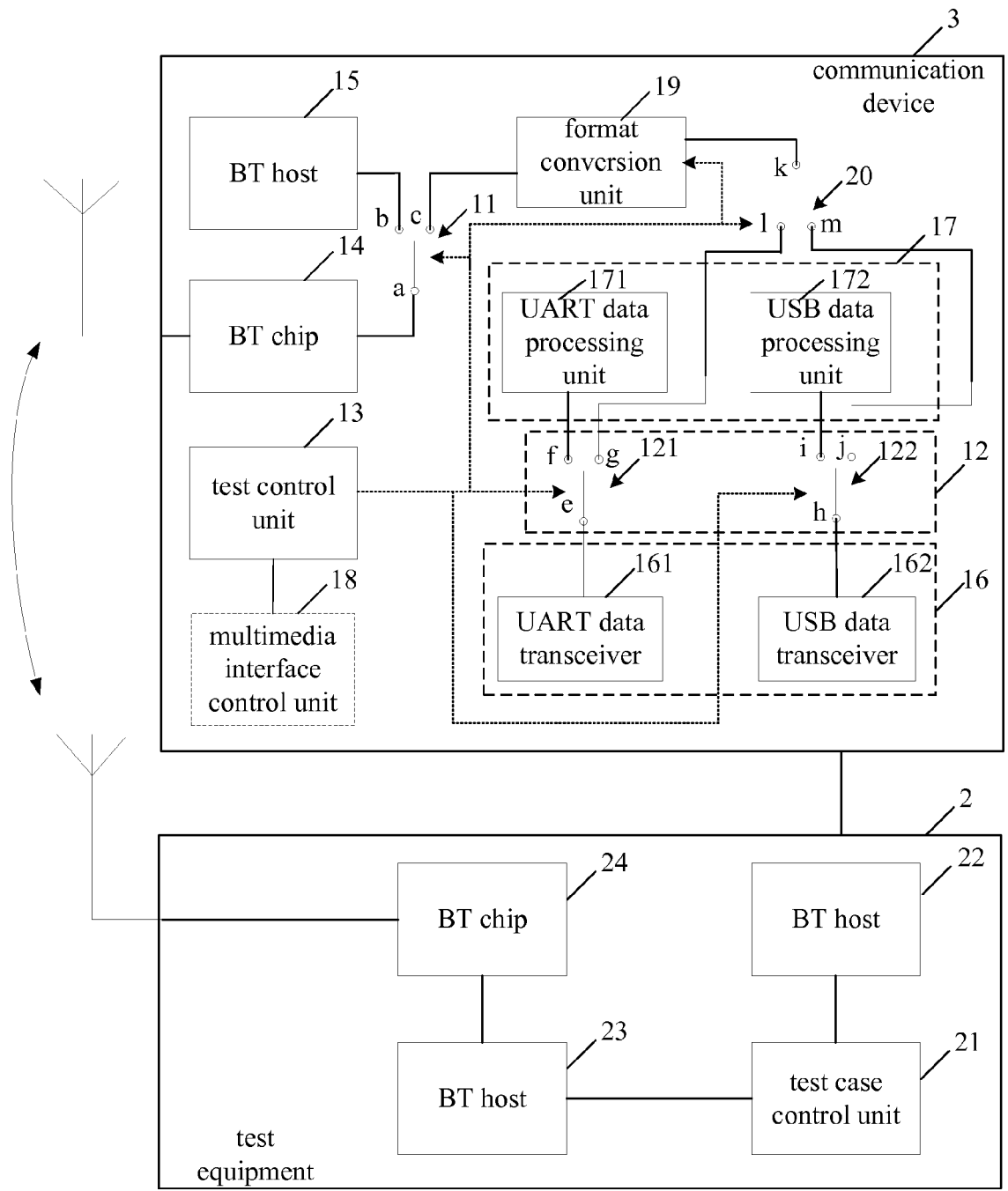
FIG. 5 schematically illustrates a structural diagram of a test system according to one embodiment of the present disclosure.

Referring to FIG. 5, when the communication device 3 is connected with the test equipment 2, a test system for testing a Bluetooth chip is established, in which a format of commands, instructions or data received and transmitted by the Bluetooth chip may be different from that of the data transport interface 16 (namely, different from that of the test equipment 2).

Figure 6:
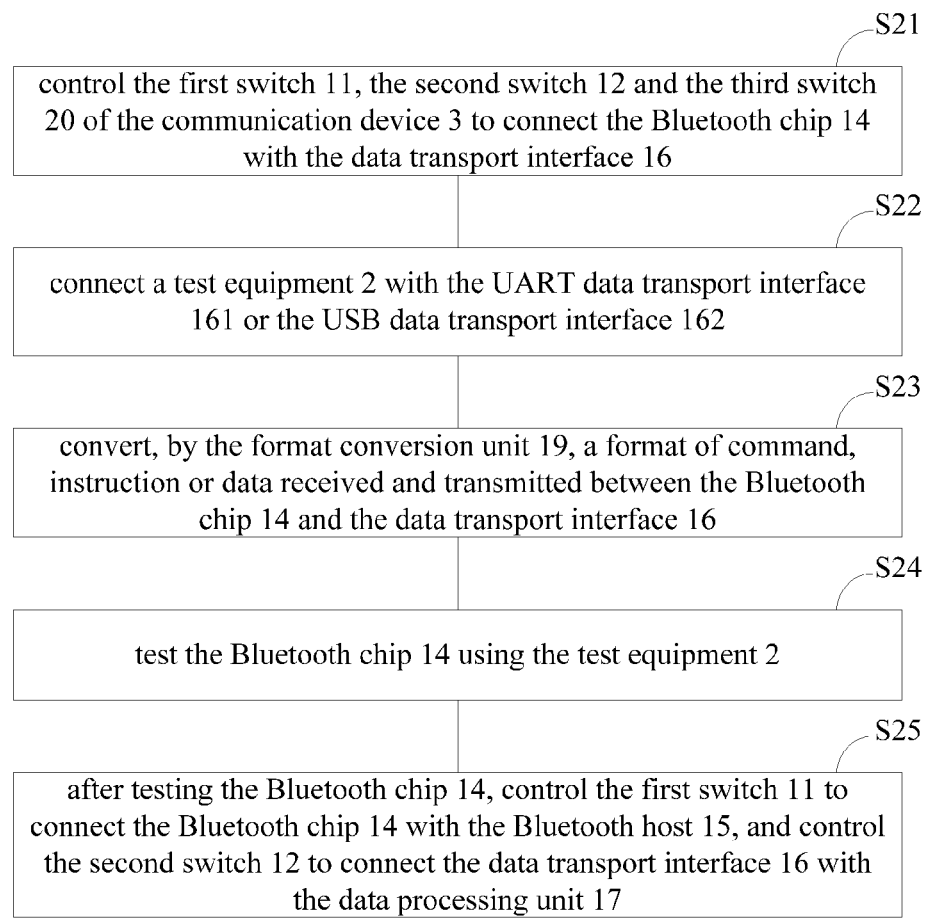
FIG. 6 schematically illustrates a flow chart of a test method according to one embodiment of the present disclosure.

In some embodiments, a test method of the test system is provided. As shown in FIG. 6, the test method includes steps of S21, S22, S23, S24 and S25.

In step S21, control the first switch 11, the second switch 12 and the third switch 20 of the communication device 3 to connect the Bluetooth chip 14 with the data transport interface 16. Compared with S11 according to the embodiment illustrated in FIG. 3, to connect the Bluetooth chip 14 with the data transport interface 16, the first switch 11, the second switch 12, together with the third switch 20 are required to be controlled by the test control unit 13. Specifically, when "node a" (illustrated as "a" in figures) and "node c" of the first switch 11 are connected, "node h" and "node j" of the switch 122 are connected, and "node k" and "node m" of the third switch 20 are connected, a connection is established between the Bluetooth chip 14 and the USB data transport interface 162 through the format conversion unit 19. Alternatively, when "node a" and "node c" of the first switch 11 are connected, "node e" and "node g" of the switch 121 are connected, and "node k" and "node l" of the third switch 20 are connected, a connection is established between the Bluetooth chip 14 and the UART data transport interface 161 through the format conversion unit 19. In test, an appropriate connection may be determined depending on the type of the data transport interface type equipped in the test equipment 2. That is, if the communication device 3 only includes one of the UART data transport interface 161 and the USB data transport interface 162, the Bluetooth chip 14 can be connected with the data transport interface 16 through the format conversion unit 19 by controlling the first switch 11 and the switch 121 or 122 of the second switch 12.

In step S22, connect a test equipment 2 with the UART data transport interface 161 or the USB data transport interface 162. The implementation of S22 may refer to S12 according to the embodiment illustrated in FIG. 3, and is not described in detail herein.

In step S23, convert, by the format conversion unit 19, a format of commands, instructions or data received and transmitted between the Bluetooth chip 14 and the data transport interface 16. In some embodiments, the format conversion may include: analyzing commands, instructions or data in a first format which are transmitted by the test equipment 2, and packaging the analyzed commands, instructions or data into a second format of commands, instructions or data which are suitable for being received by the Bluetooth chip 14; analyzing commands, instructions or data in the second format which are transmitted by the Bluetooth chip 14, and packaging the analyzed commands, instructions or data into the first format of commands, instructions or data which are suitable for being received by the test equipment 2. For example, when the Bluetooth chip 14 communicates with the Bluetooth host 15 through a shared memory, commands, instructions or data transmitted and received by the Bluetooth chip 14 is typically in a format of BlueCore Serial Protocol (BCSP). When a UART data transport interface is used, commands, instructions or data transmitted and received by the test equipment 2 is typically in a UART transport format. That is, the first format is UART transport format, while the second format is BCSP transport format. The format conversion unit 19 needs to convert format between UART and BCSP. Specifically, the format conversion may include: the format conversion unit 19 receiving commands, instructions or data in a BCSP format from the Bluetooth chip; analyzing the commands, instructions or data; packaging the analyzed commands, instructions or data into a UART format; and transmitting the commands, instructions or data in the UART format to the test equipment 2 through the UART data transport interface 161. Similarly, the format conversion may include: the format conversion unit 19 receiving commands, instructions or data in a UART format from the test equipment 2 through the UART data transport interface 161; analyzing the commands, instructions or data; and packaging the analyzed commands, instructions or data into a BCSP format, which are suitable for being received by the Bluetooth chip 14.

In step S24, test the Bluetooth chip 14 using the test equipment 2. The implementation of S24 may refer to S13 according to the embodiment illustrated in FIG. 3, and is not described in detail herein.

In step S25, after testing of the Bluetooth chip 14, control the first switch 11 to connect the Bluetooth chip 14 with the Bluetooth host 15, and control the second switch 12 to connect the data transport interface 16 with the data processing unit 17. The implementation of S25 may refer to S14 according to the embodiment illustrated in FIG. 3, and is not described in detail herein.

Besides features and advantages in the embodiment illustrated in FIG. 1-3, it is still simple for the communication device 3 to realize testing the Bluetooth chip 14 by employing the format conversion unit 19 even if the format of commands, instructions or data received and transmitted by the Bluetooth chip 14 mismatches the format of commands, instructions or data received and transmitted by the test equipment 2. The format conversion unit 19 may be implemented using an already-existed memory of the communication device 1, which may not occupy storage space of the Bluetooth chip 14. As a result, the storage resources can be saved and the cost of the Bluetooth chip 14 is lowered. Functions of the format conversion unit 19 may be set freely by uses, such that multiple data formats can be converted to match the requirements of the test equipment 2. Thus, the communication device 3 meets needs of various application scenarios and has excellent extensibility.

Figure 7:
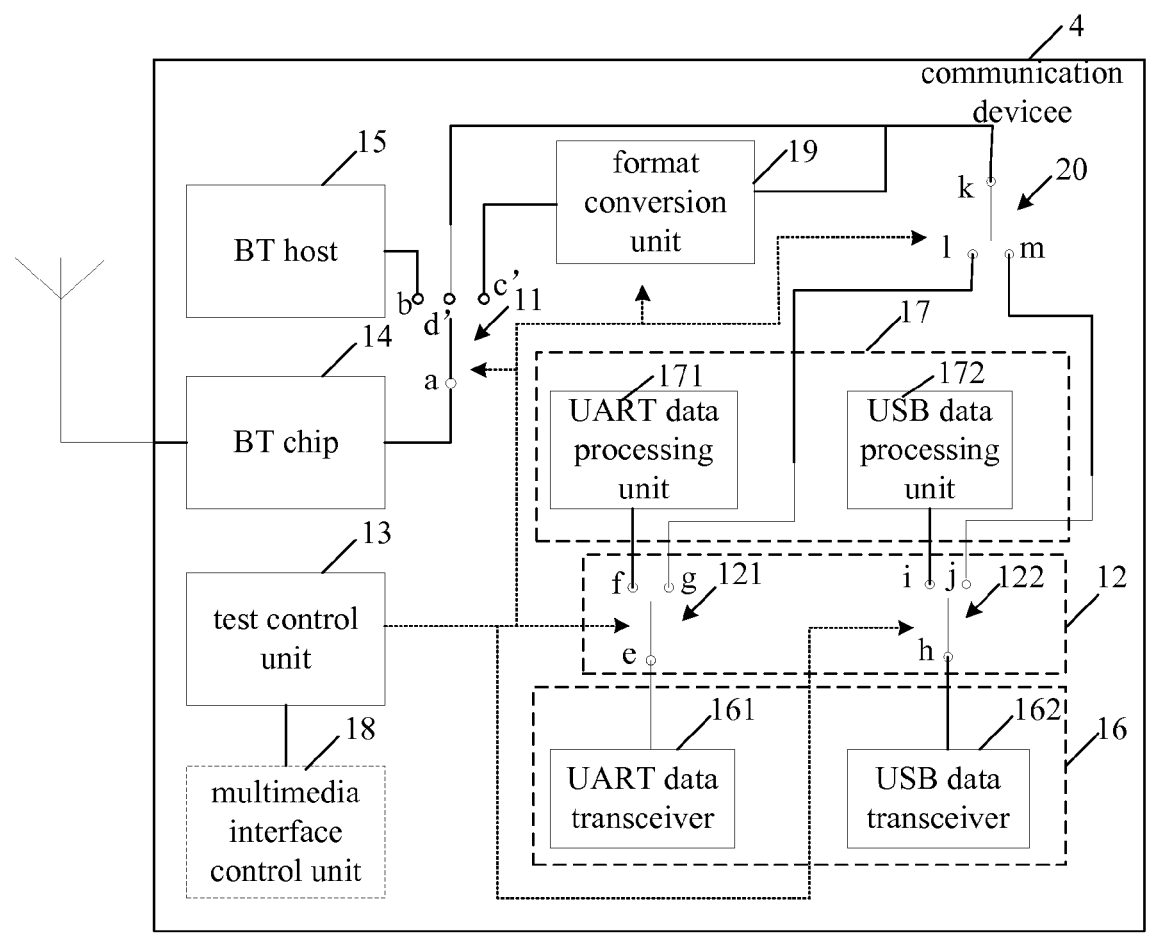
FIG. 7 schematically illustrates a structural diagram of a communication device according to one embodiment of the present disclosure.

FIG. 7 schematically illustrates a structural diagram of a communication device 4 according to one embodiment of the present disclosure. Referring to FIG. 7, the communication device 4 includes a Bluetooth chip 14, a Bluetooth host 15, a data transport interface 16, a data processing unit 17, a first switch 11, a second switch 12, a test control unit 13, a format conversion unit 19 and a third switch 20. The embodiment illustrated in FIG. 7 combines the features illustrated in FIG. 1-3 with the features illustrated in FIG. 4-6. That is, the Bluetooth chip 14 may be connected with the data transport interface 16, directly or through the format conversion unit 19. In some embodiments, when the Bluetooth chip 14 matches a format of commands, instructions or data received and transmitted by the test equipment 2, the first switch 11 is controlled to connect "node a" with "node d'". Correspondingly, the second switch 12 and the third switch 20 are controlled to establish a direct connection between the Bluetooth chip 14 and the data transport interface 16. In some embodiments, when a format of commands, instructions or data received and transmitted by the Bluetooth chip 14 is different from a format of commands, instructions or data received and transmitted by the test equipment 2, the first switch 11 is controlled to connect "node a" with "node c'". Then, the second switch 12 and the third switch 20 are controlled to establish a connection between the Bluetooth chip 14 and the data transport interface 16 through the format conversion unit 19.

When the communication device 4 is connected with a test equipment 2, a test system applicable for testing the Bluetooth chip 14 is formed. The test method using the test system to test a target test chip may refer to the embodiment illustrated in FIG. 6, and is not described in detail herein. It should be noted that, the configuration of the first switch 11 of the embodiment illustrated in FIG. 7 is different from that of the second switch 12. According to the embodiment illustrated in FIG. 7, the first switch 11 may be set depending on whether or not the format of commands, instructions or data received and transmitted by the Bluetooth chip 14 is the same with the format of commands, instructions or data received and transmitted by the test equipment 2. That is, if the format of commands, instructions or data received and transmitted by the Bluetooth chip 14 is the same with the format of commands, instructions or data received and transmitted by the test equipment 2, "node a" and "node d" of the first switch 11 are connected; and, if not, "node a" and "node c'" of the first switch 11 are connected.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

We claim:

1. A communication device, comprising:
   a baseband chip;
   a target test chip integrated into the baseband chip;
   an upper-layer processing unit corresponding to the target test chip; and
   at least one data transport interface and at least one data processing unit corresponding to the at least one data transport interface,
   wherein the communication device further comprises:
   a first switch, adapted to connect the target test chip with the at least one data transport interface or the upper-layer processing unit;
   a second switch, adapted to connect the at least one data transport interface with its corresponding data processing unit or the target test chip; and
   a test control unit, configured to control the first switch and the second switch to connect the data transport interface with the target test chip, so as to enable the communication device to test the target test chip.

2. The communication device according to claim 1, further comprising a format conversion unit configured to, when a first format of commands, instructions or data received and transmitted by the target test chip is different from a second format of commands, instructions or data received and transmitted by the test equipment, convert the first format of commands, instructions or data into the second format of commands, instructions or data, or convert the second format of commands, instructions or data into the first format of commands, instructions or data under control of the test control unit.

3. The communication device according to claim 2, further comprising a third switch connected with the format conversion unit, which is configured to connect the format conversion unit with the at least one data transport interface under the control of the test control unit, such that a connection between the target test chip and the at least one data transport interface is established through the first switch, the format conversion unit and the third switch.

4. The communication device according to claim 3, wherein the first switch, the second switch or the third switch is implemented in hardware or software.

5. The communication device according to claim 2, further comprising a third switch, wherein the first switch and the third switch are configured to: under the control of the test control unit, respectively connect the target test chip with the format conversion unit and connect the format conversion unit with the at least one data transport interface; or, under the control of the test control unit, connect the target test chip with the at least one data transport interface.

6. The communication device according to claim 5, wherein the first switch, the second switch or the third switch is implemented in hardware or software.

7. The communication device according to claim 1, wherein the test control unit is further configured to control the first switch to connect the target test chip with the upper-layer processing unit, and control the second switch to connect the at least one data transport interface with its corresponding data processing unit.

8. The communication device according to claim 1, wherein the target test chip is a Bluetooth chip, and the upper-layer processing unit is a Bluetooth host.

9. The communication device according to claim 1, wherein the at least one data transport interface comprises at least one of UART data transport interface or USB data transport interface.

10. The communication device according to claim 1, wherein the first switch or the second switch is implemented in hardware or software.

11. The communication device according to claim 1, further comprising a multimedia interface control unit configured to display an operation interface on a multimedia interface of the communication device, and translate an operation signal generated by user operation into a control signal to the test control unit.

12. A test method of the test system according to claim 11, comprising:
    controlling the first switch and the second switch of the communication device to connect the target test chip with the at least one data transport interface;
    connecting the test equipment with the at least one data transport interface; and
    testing the target test chip using the test equipment.

13. The test method according to claim 12, further comprising: when a first format of commands, instructions or data received and transmitted by the target test chip is different from a second format of commands, instructions or data received and transmitted by the test equipment, converting the first format of commands, instructions or data into the second format of commands, instructions or data, or converting the second format of commands, instructions or data into the first format of commands, instructions or data.

14. The test method according to claim 13, wherein converting the format of the commands, instructions or data comprise:
    analyzing commands, instructions or data in a first format which are transmitted by the test equipment, and packaging the analyzed commands, instructions or data into a second format of commands, instructions or data which are suitable for being received by the target test chip; and
    analyzing commands, instructions or data in the second format which are transmitted by the target test chip, and packaging the analyzed commands, instructions or data into the first format of commands, instructions or data which are suitable for being received by the test equipment.

15. The test method according to claim 12, wherein connecting the target test chip with the at least one data transport interface comprises: when the number of the at least one data transport interface is greater than 1, selecting one data transport interface of the at least one data transport interface to be connected with the target test chip.

16. The test method according to claim 12, wherein connecting the test equipment with the at least one data transport interface comprises: when the number of the at least one data transport interface is greater than 1, connecting the test equipment with one of the at least one data transport interface which matches a format of the commands, instructions or data transmitted and received by the test equipment.

17. The test method according to claim 12, further comprising: after testing of the target test chip, controlling the first switch to connect the target test chip with its corresponding upper-layer processing unit, and controlling the second switch to connect the at least one data transport interface with its corresponding data processing unit.

18. The test method according to claim 12, further comprising: receiving an operation signal generated based on user's operation; and transforming the operation signal into a control signal to the test control unit, so as to control the first switch and the second switch according to the control signal.

19. A test system, comprising the communication device according to claim 1, and a test equipment for testing a target test chip included in the communication device.

20. The test system according to claim 19, wherein the communication device further comprises a format conversion unit configured to, when a first format of commands, instructions or data received and transmitted by the target test chip is different from a second format of commands, instructions or data received and transmitted by the test equipment, convert the first format of commands, instructions or data into the second format of commands, instructions or data, or convert the second format of commands, instructions or data into the first format of commands, instructions or data under control of the test control unit.

* * * * *